(12) United States Patent
Liu

(10) Patent No.: US 10,636,896 B2
(45) Date of Patent: Apr. 28, 2020

(54) SEMICONDUCTOR STRUCTURE AND METHOD FOR MANUFACTURING THE SAME

(71) Applicant: Shanghai Huahong Grace Semiconductor Manufacturing Corporation, Shanghai (CN)

(72) Inventor: Xianzhou Liu, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 26 days.

(21) Appl. No.: 16/164,758

(22) Filed: Oct. 18, 2018

(65) Prior Publication Data

US 2019/0326415 A1    Oct. 24, 2019

(30) Foreign Application Priority Data

Apr. 24, 2018    (CN) .......................... 2018 1 0373304

(51) Int. Cl.

| H01L 29/66 | (2006.01) |
|---|---|
| H01L 21/265 | (2006.01) |
| H01L 21/266 | (2006.01) |
| H01L 21/311 | (2006.01) |
| H01L 29/08 | (2006.01) |

(52) U.S. Cl.
CPC ...... *H01L 29/66681* (2013.01); *H01L 21/266* (2013.01); *H01L 21/26513* (2013.01); *H01L 21/31111* (2013.01); *H01L 21/31116* (2013.01); *H01L 29/086* (2013.01); *H01L 29/0865* (2013.01); *H01L 29/0878* (2013.01); *H01L 29/0882* (2013.01)

(58) Field of Classification Search
CPC ............. H01L 2924/00; H01L 29/7835; H01L 21/823481; H01L 21/823493; H01L 21/8249; H01L 29/7816
See application file for complete search history.

(56) References Cited

U.S. PATENT DOCUMENTS 9,997,626 B2 *    6/2018    Duan .................. H01L 29/7816
2010/0102388 A1 *    4/2010    Levin .............. H01L 21/823418
257/343

* cited by examiner

*Primary Examiner* — Jaehwan Oh
(74) *Attorney, Agent, or Firm* — Harness, Dickey & Pierce, P.L.C.

(57) ABSTRACT

A method for manufacturing the semiconductor structure, including: providing a substrate including a first doping region, wherein a field oxide film is disposed on a top surface of the first doping region, a first pattern layer is disposed on a top surface of the field oxide film, and the first pattern layer exposes a portion of the top surface of the field oxide film; etching the field oxide film with the first pattern layer as a mask until a top surface of the substrate is exposed; forming a second doping region in the first doping region with the first pattern layer and the field oxide film as a mask; and forming a plurality of gate structures on a portion of a top surface of the second doping region, a spacer of the field oxide film and a portion of the top surface of the field oxide film.

10 Claims, 6 Drawing Sheets

SEMICONDUCTOR STRUCTURE AND METHOD FOR MANUFACTURING THE SAME

CROSS-REFERENCE TO RELATED APPLICATIONS

This application claims the benefit of priority to Chinese Patent Application No. 201810373304.0, titled "SEMICONDUCTOR STRUCTURE AND METHOD FOR MANUFACTURING THE SAME", filed on Apr. 24, 2018, the entire disclosure of which is incorporated herein by reference.

TECHNICAL FIELD

The disclosure generally relates to a semiconductor manufacturing field, and more particularly, to a semiconductor structure and a method for manufacturing the semiconductor structure.

BACKGROUND

A lateral double diffused metal-oxide-semiconductor (LDMOS) is widely used in power devices due to its high breakdown voltage and compatibility with a complementary metal-oxide-semiconductor (CMOS) process. A source region and a drain region in a conventional MOS transistor are symmetrical relative to a gate. Compared with the conventional MOS transistor, a drain region in the LDMOS is farther from a gate than a source region. In the LDMOS, a long lightly doped region, called a drift region, is disposed between the drain region and the gate region. When the source region and the drain region are coupled with a high voltage, the LDMOS bears a high voltage drop through the drift region, to achieve a high breakdown voltage.

However, performance of the conventional LDMOS needs to be further improved.

SUMMARY

Embodiments of the present disclosure provide a semiconductor structure and a method for manufacturing the semiconductor structure, to improve performance of a semiconductor device.

Embodiments of the present disclosure provide a method for manufacturing a semiconductor structure, including: providing a substrate including a first doping region, wherein the first doping region is doped with first doping ions, a field oxide film is disposed on a top surface of the first doping region, a first pattern layer is disposed on a top surface of the field oxide film, and the first pattern layer exposes a portion of the top surface of the field oxide film; etching the field oxide film with the first pattern layer as a mask until a top surface of the substrate is exposed; after the top surface of the substrate is exposed, forming a second doping region in the first doping region with the first pattern layer and the field oxide film as a mask, wherein the second doping region is doped with second doping ions, a conduction type of the second doping ions is opposite to a conduction type of the first doping ions, and a concentration of the second doping ions is greater than a concentration of the first doping ions; and forming a plurality of gate structures on a portion of a top surface of the second doping region, a spacer of the field oxide film and a portion of the top surface of the field oxide film.

In some embodiments, the field oxide film is etched with the first pattern layer as a mask using a dry etching process; and after the dry etching process, the field oxide film has the spacer perpendicular to its top surface.

In some embodiments, the field oxide film has a thickness within a range from 500 angstroms to 3,000 angstroms.

In some embodiments, forming the plurality of gate structures includes: forming a gate structure film on the top surface of the second doping region, and the spacer and the top surface of the field oxide film, wherein a third pattern layer is disposed on a portion of the top surface of the second doping region and the top surface of the field oxide film; and etching the gate structure film with the third pattern layer as a mask to form the plurality of gate structures, wherein the third pattern layer on the top surface of the second doping region along a direction perpendicular to the spacer of the field oxide film has a size within a range from 0.05 μm to 0.07 μm.

In some embodiments, when a thickness of the gate structure film is greater than the thickness of the field oxide film, a size of a bottom of the gate structure along a direction perpendicular to the spacer of the field oxide film is determined by the thickness of the field oxide film; and wherein the size of the bottom of the gate structure along the direction perpendicular to the spacer of the field oxide film is within a range from 0.04 μm to 0.25 μm.

In some embodiments, when a thickness of the gate structure film is less than the thickness of the field oxide film, along a direction perpendicular to the spacer of the field oxide film, a size of a bottom of the gate structure is equal to the thickness of the gate structure film.

In some embodiments, the field oxide film includes silicon oxide.

In some embodiments, following forming the second doping region, and prior to forming the plurality of gate structures, the method further includes: forming a second pattern layer on the top surface of the substrate, the top surface of the second doping region, a portion of the spacer and a portion the top surface of the field oxide film, wherein the second pattern layer exposes the other portion of the top surface of the field oxide film; etching the field oxide film with the second pattern layer as a mask until the top surface of the substrate is exposed; and after the top surface of the substrate is exposed, forming a third doping region in the first doping region, wherein the third doping region is doped with third doping ions, the third doping ions and the first doping ions have the same conduction type, and the third doping region and the second doping region are disposed at different sides of the field oxide film respectively.

In some embodiments, the field oxide film is etched with the second pattern layer as a mask using a wet etching process; and after the field oxide film is etched with the second pattern layer as a mask, the spacer of the field oxide film is inclined relative to the top surface of the field oxide film.

In some embodiments, after the plurality of gate structures are formed, the method further includes: forming a source region in the second doping region disposed aside of the gate structure; and forming a drain region in the first doping region disposed aside of the gate structure.

Embodiments of the present disclosure have following advantages.

Since the second doping region is disposed in the first doping region, a position of the second doping region is unchanged relative to the first doping region even if a position of the first doping region is shifted. Moreover, after the field oxide film is etched with the first pattern layer as a mask, the second doping region is formed with the first pattern layer and the field oxide film as a mask, so that the position of the second doping region is determined relative to the field oxide film. Therefore, relative positions of the first doping region, the second doping region, and the field oxide film are all determined. The plurality of gate structures formed subsequently cover a portion of the top surface of the second doping region and a portion of the top surface and the spacer of the field oxide film, so that a position of the plurality of gate structures is determined. In addition, a size of the bottom of the plurality of gate structures along a direction perpendicular to the spacer of the field oxide film is easily determined, that is, a channel length is easily determined, which causes a small difference between an actual length of the channel and a predetermined length. Therefore, the predetermined length of the channel may be small, which is advantageous for reducing an on-resistance and increasing a cutoff frequency.

Further, when the thickness of the gate structure film is greater than the thickness of the field oxide film, the size of the bottom of the gate structure along a direction perpendicular to the spacer of the field oxide film is determined by the thickness of the field oxide film. The thickness of the field oxide film is easily controlled, which causes the size of the bottom of the gate structure along a direction perpendicular to the spacer of the field oxide film to be easily controlled.

Further, when the thickness of the gate structure film is less than the thickness of the field oxide film, along a direction perpendicular to the spacer of the field oxide film, the size of the bottom of the gate structure is equal to the thickness of the gate structure film. In addition, the thickness of the gate structure film is easily controlled, which causes that the size of the bottom of the gate structure along a direction perpendicular to the spacer of the field oxide film is easily controlled.

Further, the field oxide film is etched with the second pattern layer as a mask using a wet etching process, which causes that the spacer of the field oxide film is inclined relative to the top surface of the field oxide film. Therefore, the gate structure film on the inclined spacer of the field oxide film is easily to be removed in a subsequent process for removing the gate structure film.

DETAILED DESCRIPTION

As described in the background, performance of a LDMOS in the existing techniques needs to be improved.

Figure 1:
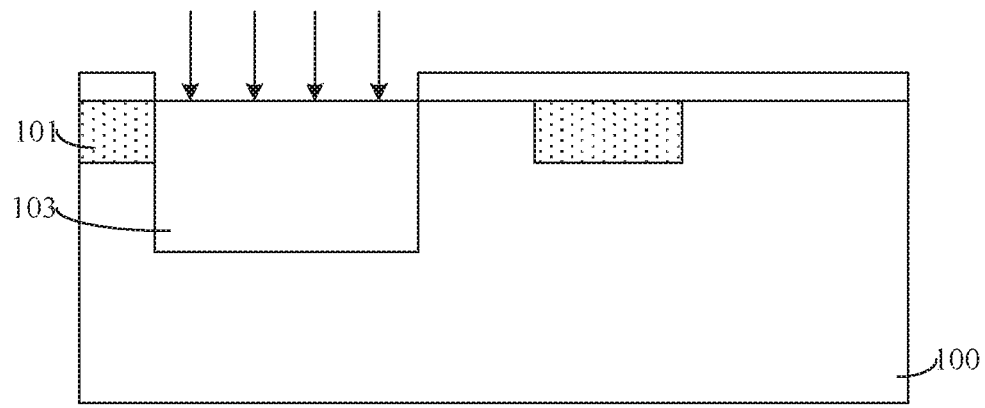
FIG. 1 to FIG. 3 schematically illustrate intermediate structural diagrams in a method for manufacturing an LDMOS.
Figure 2:
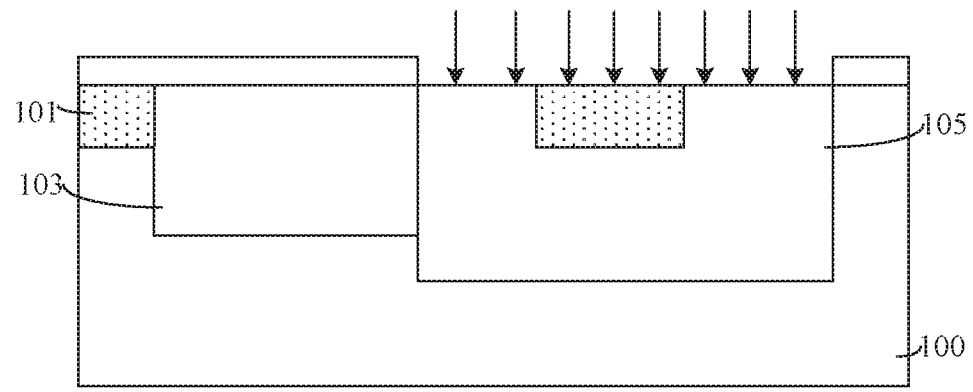
Figure 3:
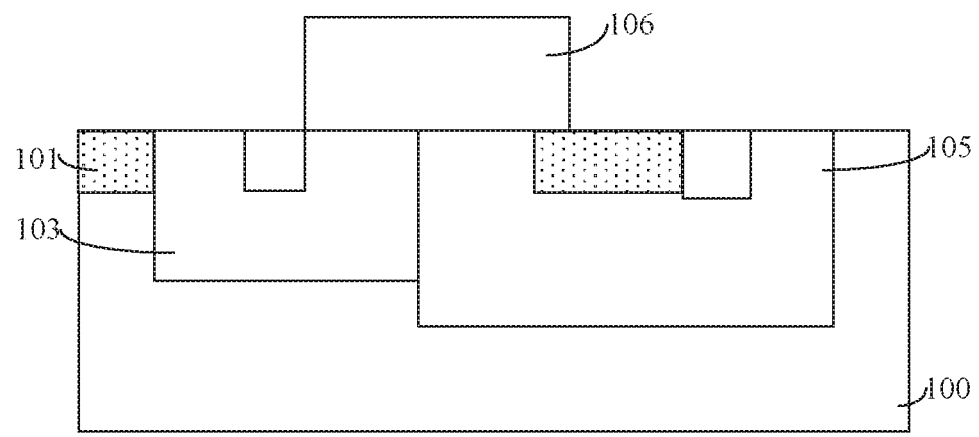

FIG. 1 to FIG. 3 schematically illustrate intermediate structural diagrams in a method for manufacturing an LDMOS.

Referring to FIG. 1, a substrate 100 is provided, and an isolation structure 101 is disposed in the substrate 100; a first doping region 103 is formed in the substrate 100 to be aligned with the isolation structure 101, wherein the first doping region 103 is doped with first doping ions.

Referring to FIG. 2, after the first doping region 103 is formed, a second doping region 105 is formed in the substrate 100 to be aligned with the isolation structure 101. The second doping region 105 is in contact with the first doping region 103, the second doping region is doped with second doping ions, and a conduction type of the second doping ions is opposite to a conduction type of the first doping ions.

Referring to FIG. 3, after the second doping region 105 is formed, a gate structure 106 is formed on a top surface of the first doping region 103 and a top surface of the second doping region 105 to be aligned with the isolation structure 101. A source region (not shown) is formed in the first doping region 103 disposed aside of the gate structure 106, and a drain region is formed in the second doping region 105 disposed aside of the gate structure 106 (not shown).

In the above method, when the first doping region 103 is formed aligning the isolation structure 101, a predetermined position of the first doping region 103 and an actual position thereof are inevitably different due to a limitation of an actual process. Similarly, when the second doping region 105 is formed aligning the isolation structure 101, a predetermined position of the second doping region 105 and an actual position thereof are inevitably different due to the limitation of the actual process; and when the gate structure 106 is formed aligning the isolation structure 101, a predetermined position of the gate structure 106 and an actual position thereof are inevitably different due to the limitation of the actual process. The first doping region 103 covered by the bottom of the gate structure 106 is a channel. Therefore, a length of the channel is affected not only by the actual position of the first doping region 103 but also by the actual positions of the second doping region 105 and the gate structure 106, that is, there is a large deviation between an actual length and a predetermined length of the channel.

In order to reduce the deviation between the actual length and the predetermined length of the channel, the predetermined length of the channel may be designed to be great. However, a great predetermined length of the channel may cause a large on-resistance of a device and a low cutoff frequency, which is not advantageous for improving performance of the device.

Figure 4:
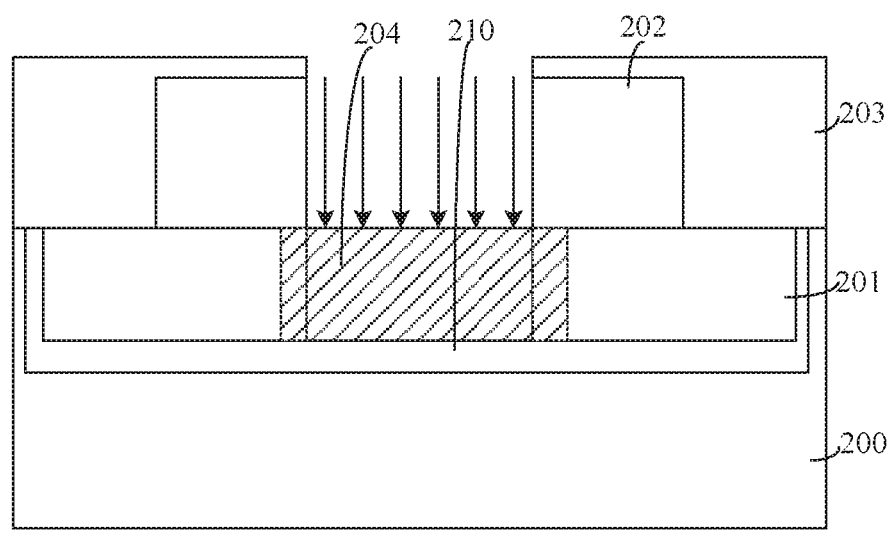
FIG. 4 schematically illustrates a structural diagram of a self-aligned LDMOS.

A method for reducing the deviation between the actual length and the predetermined length of the channel includes: forming the LDMOS using a self-aligned process, as shown in FIG. 4.

FIG. 4 schematically illustrates a structural diagram of a self-aligned LDMOS.

Referring to FIG. 4, a substrate 200 is provided; a first doping region 210 is formed in a portion of the substrate 200 and a second doping region 201 is formed in the first doping region 210, wherein the first doping region 210 is doped with first doping ions, the second doping region 201 is doped with second doping ions, and a conduction type of the second doping ions is opposite to a conduction type of the first doping ions. A gate structure 202 is formed on a portion of a top surface of the second doping region 201; a photoresist 203 is formed on a portion of a spacer and a portion a top surface of the gate structure 202, wherein the photoresist 203 exposes a portion of a top surface of the substrate 200; a third doping region 204 is formed in the first doping region 210 with the photoresist 203 and the gate structure 202 as a mask, wherein the third doping region 204 is doped with third doping ions. A conduction type of the third doping ions is the same as the conduction type of the first doping ions, and a sum of a doping concentration of the third doping ions and the doping ions is greater than a doping concentration of the second doping ions; and an annealing is performed to diffuse portions of the first doping ions and the third doping ions into the substrate 200 at a bottom of the gate structure 202.

In the above method, the photoresist 203 and the gate structure 202 are used as a mask, so that relative positions of the formed third doping region 204 and the gate structure 202 are determined. By the subsequent annealing, the first doping ions and the third doping ions are diffused toward the bottom of the gate structure 202, and a diffusion distance is a length of a channel. During the diffusion process, since the conduction type of the first doping ions and the third doping ions is opposite to the conduction type of the second doping ions, a drift of the second doping region 201 affects the diffusion distance of the first doping ions and the third doping ions, therefore, a deviation of an actual length and a predetermined length of the channel is only due to the drift of the second doping region 201, and the drift of the second doping region 201 is small. Therefore, in order to reduce a small deviation of the channel length, the predetermined length of the channel is small. However, the predetermined length of the channel is not small enough, which causes that an on-resistance is still large, and a cutoff frequency is relatively low.

Embodiments of the present disclosure provide a method for manufacturing a semiconductor structure, including: etching the field oxide film with the first pattern layer as a mask until a top surface of the substrate is exposed; after the top surface of the substrate is exposed, forming a second doping region in the first doping region, with the first pattern layer and the field oxide film as a mask, wherein the second doping region is doped with second doping ions, a conduction type of the second doping ions is opposite to a conduction type of the first doping ions, and a concentration of the second doping ions is greater than a concentration of the first doping ions; and forming a plurality of gate structures on a portion of a top surface of the second doping region, a spacer of the field oxide film and a portion of the top surface of the field oxide film. The formed device has a small channel length, a small on-resistance, and a large cutoff frequency.

The foregoing objects, features and advantages of the present disclosure will become more apparent from the following detailed description of specific embodiments of the disclosure taken in conjunction with the accompanying drawings.

FIG. 5 to FIG. 11 schematically illustrate intermediate structural diagrams in manufacturing processes of the semiconductor structure according to an embodiment of the present disclosure.

Figure 5:
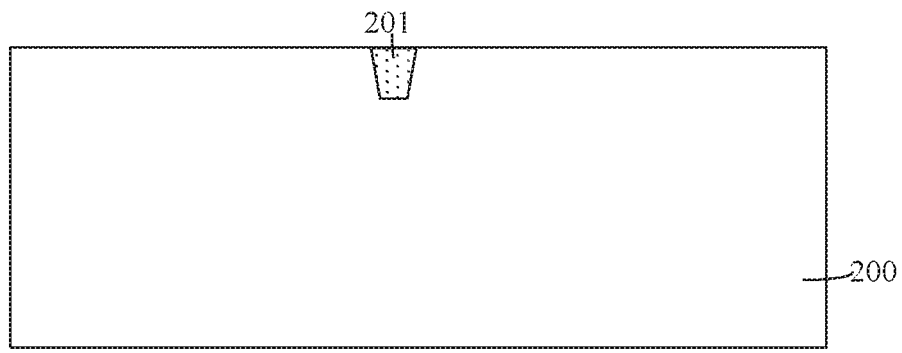
FIG. 5 to FIG. 11 schematically illustrate intermediate structural diagrams in manufacturing processes of a semiconductor structure according to an embodiment of the present disclosure.

Referring to FIG. 5, a substrate is provided.

The substrate 200 serves as a platform for a subsequent formation of an LDMOS device.

In some embodiment, the substrate 200 includes silicon. In other embodiments, the substrate 200 may include germanium, silicon germanium, silicon carbide, silicon-on-insulator (SOI), germanium-on-insulator (GOI) or III-V compound, wherein the III-V compound includes gallium arsenide.

The substrate 200 has fourth doping ions therein, and the fourth doping ions are n-type ions or a p-type ion. A type of the fourth doping ions is selected according to the type of the formed LDMOS device. When the LDMOS device to be formed is an n-type LDMOS device, the fourth doping ions are p-type ions; when the LDMOS device to be formed is a p-type LDMOS device, the fourth doping ions are n-type ions.

The p-type ions may include one or more ions from a group of boron ions, indium ions, and gallium ions. The n-type ion may include one or more ions from a group of phosphorus ions, arsenic ions, and strontium ions.

In some embodiment, the substrate 200 is doped with the fourth doping ions using a fourth ion implantation process.

The substrate 200 further has an isolation structure 201 therein, wherein the isolation structure 201 is configured to achieve an electrical isolation between semiconductor devices.

In some embodiment, forming the isolation structure 201 includes: forming a mask layer (not shown) on a top surface of the substrate 200, wherein the mask layer exposes the other portion of the top surface of the substrate 200; etching the substrate 200 with the mask layer as a mask, and forming an isolation opening (not shown) in the substrate 200; forming an isolation material film in the isolation opening and on the top surface of the substrate 200; and smoothing the isolation material film until the top surface of the substrate 200 is exposed, and forming the isolation structure 201 in the isolation opening.

The mask layer may include silicon nitride or titanium nitride, and the mask layer is used as a mask for forming the isolation opening.

The substrate 200 is etched with the mask layer as a mask using only one or a combination of a dry etching process and a wet etching process.

The isolation material film may include silicon nitride or silicon oxynitride. The isolation material film is formed using a chemical vapor deposition process or a physical vapor deposition process.

The isolation material film is smoothed using a chemical mechanical polishing process.

Figure 6:
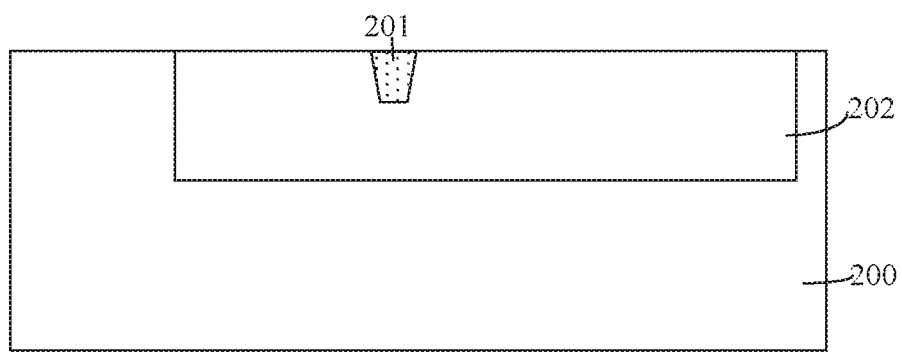

Referring to FIG. 6, a first doping region 202 is formed in the substrate 200, wherein the first doping region 202 surrounds the isolation structure 201, and the first doping region 202 is doped with first doping ions. A conduction type of the first doping ions is opposite to a conduction type of third doping ions.

Forming the first doping region 202 may include: forming a fourth pattern layer (not shown) on a portion of the top surface of the substrate 200 and the top surface of the isolation structure 201, wherein the fourth pattern layer exposes the portion of the top surface of the substrate 200 around the isolation structure 201; a first doping region 202 is formed in the substrate 200 with the fourth pattern layer as a mask.

The fourth pattern layer is configured to define a size and a location of the first doping region 202.

The conduction type of the first doping ions is related to a type of the LDMOS device to be formed. Specifically, when the LDMOS device to be formed is an n-type LDMOS, the first doping ions are n-type ions, such as one or more ions from a group of phosphorus ions, arsenic ions, and strontium ions; when the LDMOS device to be formed is a p-type LDMOS, the first doping ions are p-type ions, such as one or more ions from a group of boron ions, indium ions, and gallium ions.

The first doping region 202 is formed with the fourth pattern layer as a mask using a third ion implantation process.

In some embodiment, parameters of the third ion implantation process may include: the first doping ions including arsenic ions, a third implantation dose within a range from 1e12 atoms/cm² to 1e13 atoms/cm², and a third implantation energy within a range from 50 keV to 3000 keV.

Figure 7:
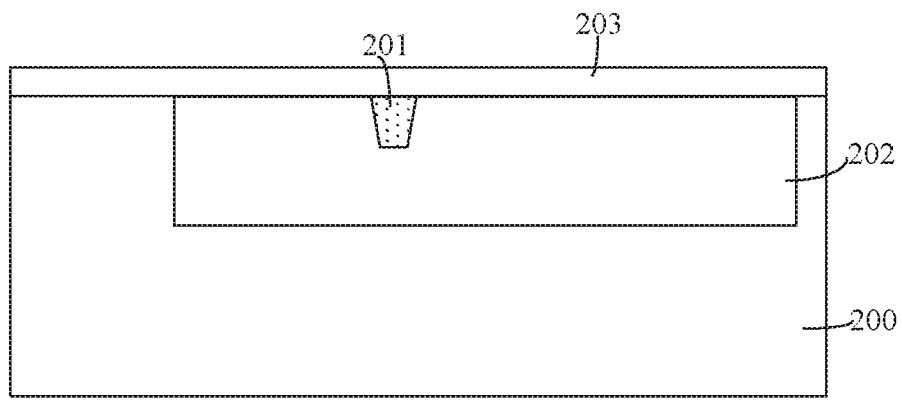

Referring to FIG. 7, a field oxide film 203 is formed on a top surface of the first doping region 202 and the top surface of the substrate 200.

The field oxide film 203 may include: silicon oxide.

The field oxide film 203 is formed using a chemical vapor deposition process or a physical vapor deposition process.

In some embodiment, a thickness of the field oxide film 203 is less than a thickness of the gate structure film subsequently formed. On one hand, the field oxide film 203 is disposed between the gate structure subsequently formed and the first doping region 202 for increasing a breakdown voltage of the LDMOS device. On the other hand, the field oxide film 203 is configured to determine a length of a channel subsequently formed.

In some embodiments, the thickness of the field oxide film 203 is greater than the thickness of the gate structure film subsequently formed, and the field oxide film 203 is configured to increase the breakdown voltage of the LDMOS device.

In some embodiment, the thickness of the field oxide film 203 is within a range from 500 angstroms to 3000 angstroms, and a reason for selecting the thickness of the field oxide film 203 is that if the thickness of the field oxide film 203 is less than 500 angstroms, a channel length is too small, which causes a small distance between a source region and a drain region subsequently formed, therefore, the source region and the drain region are prone to collusion; if the thickness of the field oxide film 203 is greater than 500 angstroms, the channel length is large, which causes a large on-resistance and a small cutoff frequency, which is disadvantageous for improving a performance of the device.

Figure 8:
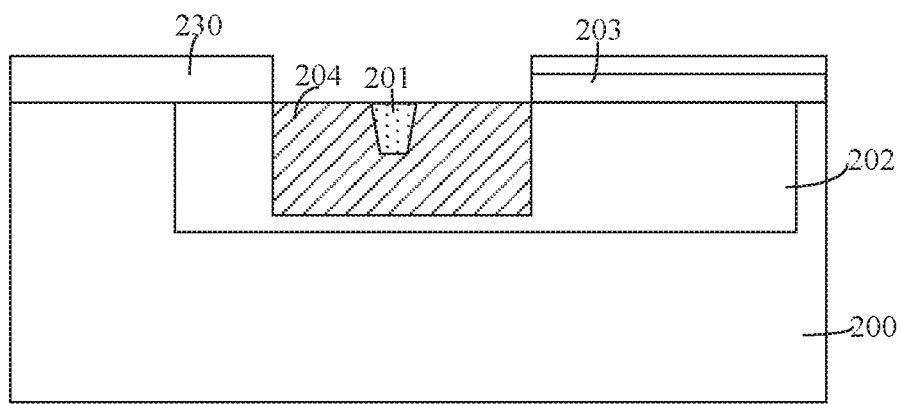

Referring to FIG. 8, a first pattern layer 230 is formed on a portion of the surface oxide film 203; and the field oxide film 203 is etched with the first pattern layer 230 as a mask until the top surface of the substrate 200 is exposed. After the top surface of the substrate 200 is exposed, a second doping region 204 is formed in the first doping region 202 with the first pattern layer 230 and the field oxide film 203 as a mask, wherein the second doping region 204 is doped with second doping ions, the conduction type of the second doping ions is opposite to the conduction type of the first doping ions, and a concentration of the second doping ions is greater than a concentration of the first doping ions.

The first pattern layer 230 is configured to determine a location of the second doping region 204.

The field oxide film 203 is etched with the first pattern layer 230 as a mask using a dry etching process. The dry etching process has a high etching rate of the field oxide film 203 along a direction perpendicular to the top surface of the substrate 200, and a low etching rate of the field oxide film 203 along a direction parallel to the top surface of the substrate 200. Therefore, after the field oxide film 203 is etched with the first pattern layer 230 as a mask, a spacer of the first pattern layer 230 is flush with a spacer of the field oxide film 203. Subsequently, the second doping region 204 is formed with the first pattern layer 230 and the field oxide film 203 as a mask, and a position of the second doping region 204 is determined relative to a position of the field oxide film 203.

The second doping region 204 is formed in the substrate 200 with the first pattern layer 230 and the field oxide film 203 as a mask using a first ion implantation process.

In this embodiment, parameters of the first ion implantation process may include: the second doping ions including boron ions, a first implantation dose within a range from 1e12 atoms/cm² to 1e14 atoms/cm², and a first implantation energy within a range from 10 keV to 300 keV.

The second doping region 204 is configured to form a source region subsequently. If the first implantation dose is small, a threshold voltage of the source region is low, which is beneficial to reducing a resistance of the source region. Moreover, it is advantageous for reducing a photolithography process for forming the doping region without additionally forming a high concentration doping region, which is advantageous for making process steps simple, and reducing complexity of the process and a cost of manufacturing the LDMOS device.

The conduction type of the second doping ions is related to a type of LDMOS device to be formed. Specifically, when the LDMOS device to be formed is a p-type LDMOS, the second doping ions are n-type ions; when the LDMOS device to be formed is an n-type LDMOS, the second doping ions are p-type ions.

Since the second doping region 204 is disposed in the first doping region 202, a position of the second doping region 204 is determined relative to the first doping region 202 even if a position of the first doping region 202 is shifted. Moreover, the second doping region 204 is formed with the first pattern layer 230 and the field oxide film 203 as a mask, so that the position of the second doping region 204 is determined relative to the field oxide film 203. Therefore, relative positions of the first doping region 202, the second doping region 204, and the field oxide film 203 are all determined. The gate structure formed subsequently covers a portion of the top surface of the second doping region 204, and a portion of the spacer and the top surface of the field oxide film 203, so that a position of the gate structure is determined. In addition, in the process for forming the gate structure, since the thickness of the gate structure film is larger than the thickness of the field oxide film 203, a size of the bottom of the gate structure covering the second doping region 204 is determined by the thickness of the field oxide film 203. That is, the channel length is determined by the thickness of the field oxide film 203. When the thickness of the field oxide film 203 is determined, the length of the channel is also determined. Therefore, a deviation between an actual length of the channel and a predetermined length is small, and the predetermined length of the channel can be designed to be small, which is advantageous for reducing an on-resistance and increasing a cutoff frequency.

Figure 9:
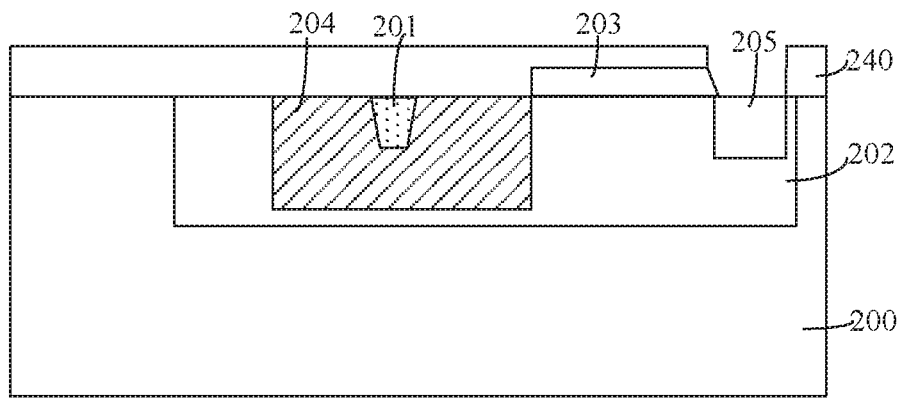

Referring to FIG. 9, a second pattern layer 240 is formed on the top surface of the substrate 200, the top surface of the first doping region 202 and the top surface of the second doping region 204, and on a portion of the spacer and a portion of the top surface of the field oxide film 203, wherein the second pattern layer 240 exposes the other portion of the top surface of the field oxide film 203; the field oxide film 203 is etched with the second pattern layer 240 as a mask until the top surface of the substrate 200 is exposed; after exposing the top surface of the substrate 200, a third doping region 205 is formed in the first doping region 202 with the second pattern layer 240 and the field oxide film 203 as a mask, wherein the third doping region 205 is doped with third doping ions. The third doping ions and the first doping ions have the same conduction type, and a doping concentration of the third doping ions is greater than a doping concentration of the first doping ions.

Before the second pattern layer 240 is formed, the method further includes: removing the first pattern layer 230. The first pattern layer 230 is removed using one or more processes from a group of an ashing process, a dry etching process, and a wet etching process.

The field oxide film 203 is etched with the second pattern layer 240 as a mask using a wet etching process.

After the wet etching process, a spacer of the field oxide film 203 is inclined relative to the bottom surface, so that when the gate structure film is removed subsequently, the gate structure film on the inclined spacer of the field oxide film 203 is easily removed. A gate structure is formed only on the top surface of the second doping region 204.

A conduction type of the third doping ions is related to a type of the LDMOS device to be formed. Specifically, when the LDMOS device to be formed is an n-type LDMOS, the third doping ions is are n-type ions; when the LDMOS device to be formed is a p-type LDMOS, the first doping ions are p-type ions.

The third doping region 205 is formed using a second ion implantation process. In some embodiment, parameters of the second ion implantation process may include: the third doping ions including arsenic ions, and the second implantation dose within a range from 1e12 atoms/cm$^2$~1e14 atoms/cm$^2$, the second implantation energy within a range from 10 keV to 500 keV.

Figure 10:
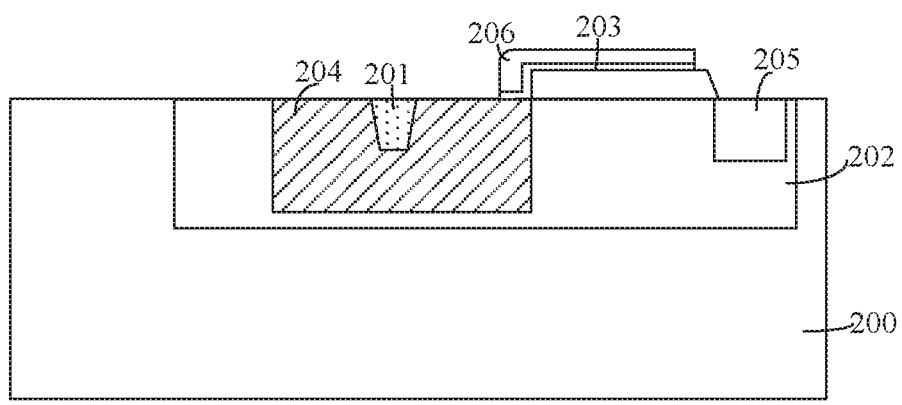

Referring to FIG. 10, a gate structure 206 is formed on a portion of the top surface of the second doping region 204, a spacer of the field oxide film 203 and a portion of the top surface of the field oxide film 203.

Before the gate structure 206 is formed, the method further includes: removing the second pattern layer 240.

The second pattern layer 240 is removed using one or more processes from a group of an ashing process, a dry etching process, and a wet etching process.

Forming the gate structure 206 may include: forming a gate structure film on the top surface of the substrate 200, the top surface of the first doping region 202 and the top surface of the second doping region 204, and the spacer and the top surface of the field oxide film 203, wherein a third pattern layer is disposed on a surface of the gate structure film, and the third pattern layer covers a portion of the top surface of the second doping region 204 and a gate film on a portion of the spacer of the field oxide film 203 and the top surface of the field oxide film 203; and etching the gate structure film with the third pattern layer as a mask until the top surface of the first doping region 202, the top surface of the second doping region 204 and the top surface of the field oxide film 203 are exposed, to form the gate structure 206.

The gate structure film may include a gate dielectric film and the gate film on a top surface of the gate dielectric film. The gate dielectric film may include silicon oxide, and the gate film may include silicon.

The gate structure film is etched with the third pattern layer as a mask using one or more processes from a group of a dry etching process and a wet etching process.

In the process for etching the gate structure film with the third pattern layer as a mask, since the spacer of the field oxide film 203 adjacent to the second doping region 204 is perpendicular to the top surface of the field oxide film 203, a thickness of the gate structure film covering the spacer of the field oxide film 203 is greater than a thickness of gate structure film covering the top surface of the field oxide film 203, wherein the spacer of the field oxide film 203 is adjacent to the second doping region 204. Therefore, after the gate structure film is etched with the third pattern layer as a mask, the gate structure film covering the spacer of the field oxide film 203 adjacent to the second doping region 204 is not removed, that is, the gate structure 206 is formed. In addition, the spacer of the field oxide film 203 adjacent to the third doping region 205 is inclined relative to the top surface of the field oxide film 203, so that a difference in thickness between the gate structure film covering the spacer and the top surface of the field oxide film 203 adjacent to the third doping region 205 is small. Therefore, after the gate structure film is etched with the third pattern layer as a mask, the gate structure film on the inclined spacer of the field oxide film 203 is removed, that is, the gate structure 206 is only formed on the spacer of the field oxide film 203 adjacent to the second doping region 204.

Since positions of the first doping region 202 and the second doping region 204 are determined relative to the field oxide film 203, and the gate structure 206 covers a portion of the top surface of the second doping region 204 and a portion of the spacer and top surface of the field oxide film 203, therefore, a channel position is determined. Further, since the thickness of the gate structure film is larger than the thickness of the field oxide film 203, the channel length is determined by the thickness of the field oxide film 203. When the thickness of the field oxide film 203 is determined, the channel length is constant, and therefore, there is only a small difference between an actual length of the channel and a predetermined length, so that the predetermined length of the channel may be small, which causes a small on-resistance and a large cutoff frequency.

The third pattern layer on the top surface of the second doping region 204 along a direction perpendicular to the spacer of the field oxide film 203 may have a size within a range from 0.05 μm to 0.07 μm.

In some embodiment, the thickness of the gate structure film is greater than the thickness of the field oxide film 203, and with a shadow effect, a size of the gate structure 206 along a direction perpendicular to the spacer of the field oxide film 203 is determined by the thickness of the oxide film 203. The size of the gate structure 206 a direction perpendicular to the spacer of the field oxide film 203 is within a range from 0.04 μm to 0.25 μm.

In some embodiments, when the thickness of the gate structure film is less than the thickness of the field oxide film, along a direction perpendicular to the spacer of the field oxide film, a size of a bottom of the gate structure is equal to the thickness of the gate structure film.

A reason of selecting the size of the gate structure 206 along a direction perpendicular to the spacer of the field oxide film 203 is that if the size of the gate structure 203 along a direction perpendicular to the spacer of the field oxide film 203 is less than 0.04 μm, the distance between the source region and the drain region subsequently formed is small, therefore, the source region and the drain region are prone to collusion; if the gate structure 206 along a direction perpendicular to the spacer of the field oxide film 203 is greater than 0.25 μm, an on-resistance is large and a cutoff frequency is small.

Figure 11:
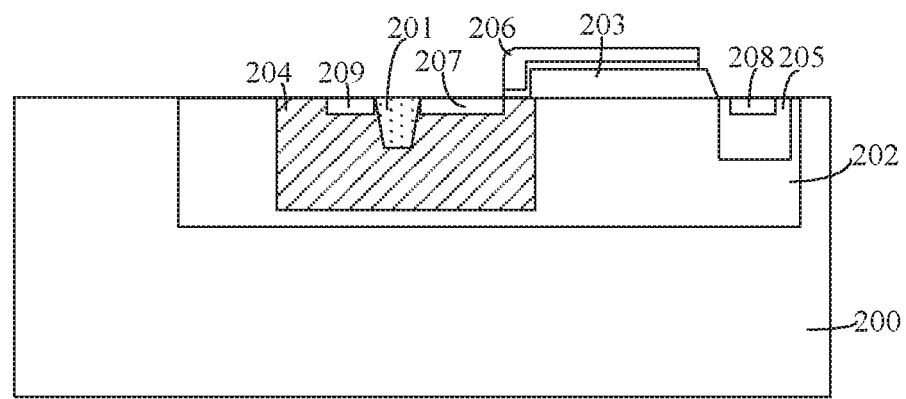

Referring to FIG. 11, the source region 207 is formed in the second doping region 204 disposed aside of the gate structure 206; and the drain region 208 is formed in the first doping region 202 disposed aside of the gate structure 206.

Both the source region 207 and the drain region 208 are formed by a source-drain ion implantation process. A conduction type of a source-drain ion is related to a type of LDMOS device to be formed. Specifically, when the LDMOS device to be formed is an n-type LDMOS device, the source-drain ion is are n-type ions; when the LDMOS device to be formed is a p-type LDMOS device, the source-drain ion are p-type ions.

After the source region 207 and the drain region 208 are formed, the method may further include: forming a fourth doping region 209 in the second doping region 204, wherein the fourth doping region 209 and the source region 207 are disposed at different sides of the isolation structure 201 respectively. The fourth doping region 209 is doped with fifth doping ions, and the fifth doping ions and the second doping ions have the same conduction type.

The fourth doping region 209 is configured to realize an electrical interconnection of the second doping region 204 with external devices.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

The invention claimed is:

1. A method for manufacturing a semiconductor structure, comprising:
   providing a substrate comprising a first doping region, wherein the first doping region is doped with first doping ions, a field oxide film is disposed on a top surface of the first doping region, a first pattern layer is disposed on a top surface of the field oxide film, and the first pattern layer exposes a portion of the top surface of the field oxide film;
   etching the field oxide film with the first pattern layer as a mask until a top surface of the substrate is exposed;
   after the top surface of the substrate is exposed, forming a second doping region in the first doping region with the first pattern layer and the field oxide film as a mask, wherein the second doping region is doped with second doping ions, a conduction type of the second doping ions is opposite to a conduction type of the first doping ions, and a concentration of the second doping ions is greater than a concentration of the first doping ions; and
   forming a plurality of gate structures on a portion of a top surface of the second doping region, a spacer of the field oxide film and a portion of the top surface of the field oxide film.

2. The method according to claim 1, wherein the field oxide film is etched with the first pattern layer as a mask using a dry etching process; and after the dry etching process, the field oxide film has the spacer perpendicular to its top surface.

3. The method according to claim 1, wherein the field oxide film has a thickness within a range from 500 angstroms to 3,000 angstroms.

4. The method according to claim 3, wherein forming the plurality of gate structures comprises: forming a gate structure film on the top surface of the second doping region, and the spacer and the top surface of the field oxide film, wherein a third pattern layer is disposed on a portion of the top surface of the second doping region and the top surface of the field oxide film; and etching the gate structure film with the third pattern layer as a mask to form the plurality of gate structures, wherein the third pattern layer on the top surface of the second doping region along a direction perpendicular to the spacer of the field oxide film has a size within a range from 0.05 μm to 0.07 μm.

5. The method according to claim 4, wherein when a thickness of the gate structure film is greater than the thickness of the field oxide film, a size of a bottom of the gate structure along a direction perpendicular to the spacer of the field oxide film is determined by the thickness of the field oxide film; and wherein the size of the bottom of the gate structure along the direction perpendicular to the spacer of the field oxide film is within a range from 0.04 μm to 0.25 μm.

6. The method according to claim 4, wherein when a thickness of the gate structure film is less than the thickness of the field oxide film, along a direction perpendicular to the spacer of the field oxide film, a size of a bottom of the gate structure is equal to the thickness of the gate structure film.

7. The method according to claim 1, wherein the field oxide film comprises silicon oxide.

8. The method according to claim 1, wherein following forming the second doping region, and prior to forming the plurality of gate structures, the method further comprises: forming a second pattern layer on the top surface of the substrate, the top surface of the second doping region, a portion of the spacer and a portion the top surface of the field oxide film, wherein the second pattern layer exposes the other portion of the top surface of the field oxide film; etching the field oxide film with the second pattern layer as a mask until the top surface of the substrate is exposed; and after the top surface of the substrate is exposed, forming a third doping region in the first doping region, wherein the third doping region is doped with third doping ions, the third doping ions and the first doping ions have the same conduction type, and the third doping region and the second doping region are disposed at different sides of the field oxide film respectively.

9. The method according to claim 8, wherein the field oxide film is etched with the second pattern layer as a mask using a wet etching process; and after the field oxide film is etched with the second pattern layer as a mask, the spacer of the field oxide film is inclined relative to the top surface of the field oxide film.

10. The method according to claim 1, wherein after the plurality of gate structures are formed, the method further comprises: forming a source region in the second doping region disposed aside of the gate structure; and forming a drain region in the first doping region disposed aside of the gate structure.

* * * * *